United States Patent
Wagner

(10) Patent No.: US 7,786,011 B2
(45) Date of Patent: Aug. 31, 2010

(54) COMPOSITION AND METHODS FOR FORMING METAL FILMS ON SEMICONDUCTOR SUBSTRATES USING SUPERCRITICAL SOLVENTS

(75) Inventor: Mark Ian Wagner, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 46 days.

(21) Appl. No.: 12/010,542

(22) Filed: Jan. 25, 2008

(65) Prior Publication Data

US 2008/0194103 A1  Aug. 14, 2008

Related U.S. Application Data

(60) Provisional application No. 60/898,122, filed on Jan. 30, 2007.

(51) Int. Cl.
H01L 21/44 (2006.01)
(52) U.S. Cl. ............... 438/680; 438/597; 106/1.05; 106/1.18; 106/1.19; 106/1.21; 106/1.27; 106/1.29; 257/E21.295
(58) Field of Classification Search .......... 257/1; 438/1; 427/252
See application file for complete search history.

(56) References Cited

U.S. PATENT DOCUMENTS

| | | | |
|---|---|---|---|
| 5,324,341 A * | 6/1994 | Nagel et al. | 75/503 |
| 5,789,027 A | 8/1998 | Watkins et al. | |
| 6,277,203 B1 | 8/2001 | Jiang et al. | |
| 6,323,121 B1 | 11/2001 | Liu et al. | |
| 6,337,277 B1 | 1/2002 | Chou et al. | |
| 6,457,477 B1 | 10/2002 | Young et al. | |
| 6,486,078 B1 | 11/2002 | Rangarajan et al. | |
| 6,561,220 B2 | 5/2003 | McCullough et al. | |
| 6,596,344 B2 | 7/2003 | Zhuang et al. | |
| 6,620,733 B2 | 9/2003 | Ho | |
| 6,689,700 B1 | 2/2004 | Watkins et al. | |
| 6,736,149 B2 | 5/2004 | Biberger et al. | |
| 6,777,344 B2 | 8/2004 | Annapragada et al. | |
| 6,841,483 B2 | 1/2005 | Zhu et al. | |
| 6,893,969 B2 | 5/2005 | Ho et al. | |
| 6,909,195 B2 | 6/2005 | Li et al. | |
| 6,949,411 B1 | 9/2005 | Mikhaylichenko et al. | |
| 6,992,018 B2 | 1/2006 | Watkins et al. | |
| 7,030,168 B2 | 4/2006 | Xu et al. | |
| 7,049,226 B2 | 5/2006 | Chung et al. | |
| 7,119,418 B2 | 10/2006 | Xu et al. | |
| 2003/0124785 A1 * | 7/2003 | Xu et al. | 438/200 |
| 2004/0023453 A1 | 2/2004 | Xu et al. | |
| 2004/0187792 A1 | 9/2004 | Parks | |
| 2005/0026430 A1 | 2/2005 | Kim et al. | |
| 2005/0181613 A1 | 8/2005 | Xu et al. | |
| 2005/0230351 A1 | 10/2005 | Tahara | |
| 2005/0279381 A1 | 12/2005 | Masuda et al. | |
| 2006/0099343 A1 * | 5/2006 | Thompson et al. | 427/250 |
| 2006/0102895 A1 | 5/2006 | Hendrix et al. | |
| 2006/0223312 A1 | 10/2006 | Yonker et al. | |

FOREIGN PATENT DOCUMENTS

| | | | |
|---|---|---|---|
| KR | 10-1999-0050454 A | 11/1999 | |
| KR | 10-1999-0051856 A | 11/1999 | |
| KR | 10-2004-0110672 A | 12/2004 | |

OTHER PUBLICATIONS

International Search Report and Written Opinion for PCT/US2008/000986 dated Jun. 16, 2008.
Collman, et al, "*Principles and Applications of Organotransition Metal Chemistry*", University Science Books, 1987, pp. 24-29, University Science Books, Mill Valley, California.
Co-pending U.S. Appl. No. 11/699,487, filed Jan. 30, 2007, entitled Compositions and Methods for Forming and Depositing Metal Films on Semiconductor Substrates Using Supercritical Solvents.
International Preliminary Report on Patentability issued Aug. 4, 2009 for PCT/US2008/000986.

\* cited by examiner

*Primary Examiner*—Charles D Garber
*Assistant Examiner*—Yasser A Abdelaziez
(74) *Attorney, Agent, or Firm*—Buchanan Ingersoll & Rooney PC

(57) ABSTRACT

Compositions and methods for forming metal films on semiconductor substrates are disclosed. One of the disclosed methods comprises: heating the semiconductor substrate to obtain a heated semiconductor substrate; exposing the heated semiconductor substrate to a composition containing at least one metal precursor comprising at least one ligand, an excess amount of neutral labile ligands, a supercritical solvent, and optionally at least one source of B, C, N, Si, P, and mixtures thereof; exposing the composition to a reducing agent and/or thermal energy at or near the heated semiconductor substrate; disassociating the at least one ligand from the metal precursor; and forming the metal film while minimizing formation of metal oxides.

16 Claims, No Drawings

US 7,786,011 B2

COMPOSITION AND METHODS FOR FORMING METAL FILMS ON SEMICONDUCTOR SUBSTRATES USING SUPERCRITICAL SOLVENTS

CROSS-REFERENCE TO RELATED APPLICATION

This application claims priority under 35 U.S.C. §119 to U.S. Provisional Application No. 60/898,122 entitled COMPOSITION AND METHODS FOR FORMING METAL FILMS ON SEMICONDUCTOR SUBSTRATES USING SUPERCRITICAL SOLVENTS, filed Jan. 30, 2007, the entire content of which is hereby incorporated by reference.

BACKGROUND

In the field of semiconductor manufacturing, deposition of materials such as metal films on semiconductor substrates can be carried out by a variety of techniques, including chemical vapor deposition ("CVD"), physical vapor deposition ("PVD"), and atomic layer deposition ("ALD").

Conventional CVD processes for metal film deposition occurs through the volatilization of metal precursors at high temperatures under vacuum. The selection of metal precursors available for CVD is limited by requirements such as high thermal stability and sufficient volatility of the metal precursors. When a precursor is selected and volatilized during the CVD process, the metal precursor is usually only present in the vapor at low concentrations. This can lead to limited film growth resulting in non-conformal films. Moreover, the high temperature requirements of CVD can significantly impact the thermal budget during wafer processing.

With regard to conventional PVD of metal precursors, PVD is fundamentally limited by the nature of a line-of-sight deposition process that results in non-conformal film growth and inability to deposit material in certain types of high aspect ratio structures. Additional shortcomings of PVD include the significant particle levels that are generated in the PVD process, limited control and lack of homogeneity of the deposited film, and process control issues relating to diffusion of the sputtered material.

Conventional ALD processes for deposition of thin films occurs through exposure of the substrate to alternating cycles of precursors to grow atomically thin films. While the ability to grow films in a carefully controlled manner at the atomic level results in conformal deposition, the high number of cycles required to prepare even very thin films leads to slow film growth. Moreover, repetitive valve cycling can also lead to particle generation and maintenance issues.

Currently, several integrated circuit ("IC") processes require low cost deposition of conformal thin-films for both front end of line and back end of line applications, including capacitor electrodes, barriers, and interconnects.

Some of the limitations of conventional CVD, PVD, and ALD techniques described above suggest a need in the art for improved methods of depositing metal(s) on semiconductor substrates.

SUMMARY

According to a first embodiment, a method for forming a metal film on a semiconductor substrate comprises heating the semiconductor substrate to obtain a heated semiconductor substrate; exposing the heated semiconductor substrate to a composition containing at least one metal precursor comprising at least one ligand, an excess amount of neutral labile ligands, a supercritical solvent, and optionally at least one source of B, C, N, Si, P, and mixtures thereof; exposing the composition to a reducing agent and/or thermal energy at or near the heated semiconductor substrate; disassociating the at least one ligand from the metal precursor; and forming the metal film while minimizing formation of metal oxides.

The metal film in the first embodiment can comprise one or more metals. In other embodiments, one or more layers of the metal film can be deposited.

The composition of the first embodiment can further comprise (i) at least one reducing agent, and/or (ii) at least one co-solvent.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The source of B, C, N, Si, or P can be selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, and phosphites. In other embodiments, the source of B, C, N, Si or P can be selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, and methyl Grignard.

The metal precursor of the first embodiment can be present in a range of from about 0.001 to about 20% by weight. The supercritical solvent can be present in a range of from about 10% to about 99.9% by weight. The composition of the first embodiment can be surfactant-free.

The metal precursor of the first embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor can comprise transition metals selected from the group consisting of tantalum, hafnium, zirconium, titanium, tungsten, molybdenum, chromium, and mixtures thereof.

The neutral labile ligands according to the first embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the first embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands can be selected from the group consisting of CO, acetonitrile, tetrahydrofuran, ether, and mixtures thereof.

The supercritical solvent according to the first embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The supercritical solvent can be at a temperature of from about 20° C. to about 150° C.

The temperature of the semiconductor substrate can be from about 20° C. to about 450° C.

The method according to the first embodiment can be carried out in a vessel which is pressurized from about 1000 psi to about 7000 psi.

According to a second embodiment, a method for forming a metal film on a semiconductor substrate comprises heating the semiconductor substrate to obtain a heated semiconductor substrate; exposing the heated semiconductor substrate to a composition containing at least one metal precursor comprising at least one ligand, an excess amount of neutral labile ligands, a supercritical solvent, and at least one source of B, C, N, Si, P, and mixtures thereof; exposing the composition to a reducing agent and/or thermal energy at or near the heated semiconductor substrate; displacing the at least one ligand from the metal precursor with the at least once source of B, C, N, Si, P, and mixtures thereof; and forming the metal film while minimizing formation of metal oxides.

In some embodiments, after the displacing step in the second embodiment, the metal precursor with the at least one source of B, C, N, Si, P, and mixtures thereof is modified to obtain a metal defined by $M_aX_b$, and wherein M is a metal, X is B, C, N, Si, P, or mixtures thereof, and a or b=1 to 5.

The modification can comprise exposing the metal precursor to thermal energy, reducing the metal, reducing the at least one source of B, C, N, Si, P, and mixtures thereof, and/or exposing the metal precursor to a reagent.

The metal film in the second embodiment can comprise one or more metals. In other embodiments, one or more layers of the metal film can be deposited.

The composition of the second embodiment can further comprise (i) at least one reducing agent, and/or (ii) at least one co-solvent.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The source of B, C, N, Si, or P can be selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, and phosphites. In other embodiments, the source of B, C, N, Si or P can be selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, and methyl Grignard.

The metal precursor of the second embodiment can be present in a range of from about 0.001 to about 20% by weight. The supercritical solvent can be present in a range of from about 10% to about 99.9% by weight. The composition of the second embodiment can be surfactant-free.

The metal precursor of the second embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor can comprise transition metals selected from the group consisting of tantalum, hafnium, zirconium, titanium, tungsten, molybdenum, chromium, and mixtures thereof.

The neutral labile ligands according to the second embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the second embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands can be selected from the group consisting of CO, acetonitrile, tetrahydrofuran, ether, and mixtures thereof.

The supercritical solvent according to the second embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The supercritical solvent can be at a temperature of from about 20° C. to about 150° C.

The temperature of the semiconductor substrate can be from about 20° C. to about 450° C.

The method according to the second embodiment can be carried out in a vessel which is pressurized from about 1000 psi to about 7000 psi.

According to a third embodiment, a composition for forming metal films on semiconductor substrates is disclosed. The composition comprises at least one metal precursor comprising at least one source of B, C, N, Si, P, and mixtures thereof; neutral labile ligands; at least one supercritical solvent; and optionally at least one source of B, C, N, Si, P, and mixtures thereof.

The composition of the third embodiment can further comprise (i) at least one reducing agent, and/or (ii) at least one co-solvent.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The source of B, C, N, Si, or P can be selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, phosphites, and mixtures thereof. In other embodiments, the source of B, C, N, Si or P can be selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, methyl Grignard, and mixtures thereof.

The metal precursor of the third embodiment can be present in the composition in a range of from about 0.001 to about 20% by weight. The supercritical solvent can be present in the composition in a range of from about 10% to about 99.9% by weight. The composition of the third embodiment can be surfactant-free.

The metal precursor of the third embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor can comprise transition metals selected from the group consisting of tantalum, hafnium, zirconium, titanium, tungsten, molybdenum, chromium, and mixtures thereof.

The neutral labile ligands according to the third embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the third embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands can be selected from the group consisting of CO, acetonitrile, tetrahydrofuran, ether, and mixtures thereof.

The supercritical solvent according to the third embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The metal film in the third embodiment can comprise one or more metals. In other embodiments, one or more layers of the metal film can be deposited.

DETAILED DESCRIPTION

Various embodiments disclosed herein are directed to depositing a material on a substrate surface such as a semiconductor substrate. The methods and compositions disclosed herein include the use of chemical fluid deposition ("CFD") using supercritical solvents.

The term "metal film" as used herein, refers to a film containing one or more metals and optionally one or more of the main group elements, such as, B, C, N, Si and/or P, in which the main group elements may or may not be covalently bonded to the metal. Examples include, but are not limited to, an elemental Ta(0) film, an alloy film of elemental Ta(0) and Ru(0), a Ru(0) film doped with phosphorous, and a Ta(III)N film.

The term "formal oxidation state", as used herein, refers to the hypothetical charge on a metal in a metal precursor based on generally accepted electron counting theory.

"Neutral labile ligands", as used herein, include (1) chemical moieties or molecules that can easily associate and disassociate from a metal and have a neutral charge so that there is no increase in the formal oxidation state of the metal upon association with the metal, and (2) sources of the chemical moieties or molecules described in (1).

According to an embodiment, a composition for forming metal films on semiconductor substrates comprises at least one metal precursor comprising at least one source of B, C, N, Si, P, and mixtures thereof; neutral labile ligands; at least one supercritical solvent; and optionally at least one source of B, C, N, Si, P, and mixtures thereof.

The compositions can further comprise a reducing agent, and/or a co-solvent. The compositions can be surfactant-free.

The metal precursor can be present in a range of from about 0.001 to about 20% by weight, the neutral labile ligands are present in a range of from about 0.001% to about 90% by weight, and the supercritical solvent is present in a range of from about 10% to about 99.9% by weight.

The metal precursor can comprise metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, and mercury. The metal precursor can more preferably comprise metals selected from the group consisting of titanium, zirconium, vanadium, tantalum, hafnium, chromium, molybdenum, tungsten, manganese, iron, cobalt, nickel, palladium, platinum, copper, silver, gold, zinc, cadmium, and mercury. The metal precursor can most preferably comprise metals selected from the group consisting of tantalum, hafnium, zirconium, titanium, tungsten, molybdenum, and chromium.

According to preferred embodiments, neutral labile ligands can be selected from the group consisting of ethers, nitriles, thioethers, alkenes, alkynes, acyclic dienes, aromatics, ketones, amines, phosphines, isocyanides, isonitriles, CO, dinitrogen, and mixtures thereof.

According to more preferred embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof.

Additional examples of neutral labile ligands are disclosed in "Principles and Applications of Organotransition Metal Chemistry", J. P. Collman, L. S. Hegedus, J. R. Norton, R. G. Finke; University Science Books; 1987, pp 24-29.

The supercritical solvent can be selected from the group consisting of carbon dioxide, oxygen, argon, krypton, xenon, ammonia, methane, methanol, dimethyl ketone, a hydrogen forming gas, sulfur hexafluoride, and mixtures thereof.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

Co-solvents can be useful in the deposition composition and can be of any suitable type. Illustrative species include, but are not limited to, methanol, ethanol, and higher alcohols, N-alkylpyrrolidones or N-arylpyrrolidones, such as N-methyl-, N-octyl-, or N-phenyl-pyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, and propylene carbonate.

Additional examples of the co-solvent include hydrofluorocarbons, hydrofluoroethers, sulfur hexafluoride, propane, butane, pentane, hexane, methane, dimethylformamide, N-methylpyrrolidone, diethyl ether, acetone, isopropyl alcohol, and/or dimethylsulfoxide.

The source of B, C, N, Si, or P can be selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, and phosphites. In other embodiments, the source of B, C, N, Si or P can be selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, and methyl Grignard.

A preferred deposition composition is surfactant-free. Optionally, surfactants can be added to the deposition compositions. The surfactants can be selected from the group consisting of anionic, neutral, cationic, and zwitterionic surfactants. Preferably the surfactants can be selected from the group consisting of acetylenic alcohols and diols, long alkyl chain secondary and tertiary amines, and their respective fluorinated analogs.

Additional examples of surfactants can include quaternary ammonium salts and phosphate esters, triblock copolymers of polyethylene, polypropylene, polyalkyloxide materials, triblock neutral surfactants, and/or polyoxyethylene alkyl ethers.

Although carbon dioxide is the preferred supercritical solvent in the embodiments described above, any other suitable supercritical solvent can be used to perform the same functions as carbon dioxide. Other supercritical solvents that can be used in the embodiments described above include any solvent that is in supercritical form and can penetrate the openings such as vias, trenches, etc., of semiconductor substrates. Preferably, the supercritical solvent is substantially non-polar and has a substantially negligible surface tension.

Additional details regarding suitable supercritical solvents are disclosed in, for example, commonly assigned U.S. Pre-Grant Publication Number 2004/0187792, which is herein incorporated by reference in entirety.

According to further embodiments, methods for the deposition of metal films using the compositions described in the above embodiments are disclosed.

In the metal deposition process described herein, the formal oxidation state of the metal in the metal film is the same as or lower than the oxidation state of the metal in the metal precursor. In both cases, a preliminary step in the formation of the metal film is dissociation of at least some of the ligands on the metal precursor. Dissociation of ligands will open up coordination sites on the metal precursor that may become filled with anionic Lewis base ligands such as oxygen, halides, etc. that are adventitiously present in the deposition chamber and will increase the oxidation state of the metal. In the presence of excess, neutral, labile ligands, open coordination sites on the metal precursor become kinetically favored to bind with these ligands rather than adventitious oxidizing sources. The neutral, labile ligands act as temporary placeholders to fill the coordination sites on the precursor until they are dissociated or displaced by the ligand of choice. In this manner, the addition of excess neutral labile ligands helps to prevent oxidation and facilitate the deposition of metal films.

Early transition metal precursors such as Ta tend to be electropositive, oxophilic, and form unstable low valent complexes, wherein the metal in the metal precursor has a thermodynamically disfavored oxidation state. Any empty coordination sites that become available on the metal in the metal precursor during the deposition in supercritical fluids processing will tend to be rapidly filled by anionic Lewis base ligands (i.e., oxide, halide, etc.). Binding of the metal with these anionic Lewis base ligands leads to an increase in the formal oxidation state of the metal making it substantially difficult to prepare and obtain metal films.

There is a strong thermodynamic driving force to fill empty coordination sites on early transition metal precursors, and so even very low levels of oxidizing sources during the deposition process tend to result in formation of unwanted oxidized metal species. While it is theoretically possible to remove all traces of oxidizing sources from a supercritical fluid deposition process, from a practical standpoint it is difficult to successfully remove all traces of oxidizing sources. Moreover, even if it was possible to remove all traces of oxidizing sources, such removal steps can render the deposition process ineffective based on efficiency and costs.

According to various embodiments described herein is the use of neutral labile ligands that can temporarily fill empty coordination sites on metals during deposition processes. The temporary filling of these empty coordination sites can substantially eliminate oxidation of the metal thereby facilitating the generation of metal films.

The neutral labile ligands fill the empty coordination sites temporarily because the bond formed between the neutral labile ligand and the metal is in general substantially weaker in comparison to the bond formed between a metal and a Lewis base ligand with a negative formal charge. As a result of the weak bond formed between the neutral labile ligand and the metal, the neutral labile ligand easily disassociates from the metal. The molar excess of neutral labile ligands promotes the rapid filling of the empty coordination sites on the metal in the metal precursor. The rapid filling of the empty coordination sites thereby promotes the maintenance of the low oxidation state of the metal which in turn promotes further growth of the metal film.

Several types of metal films can be produced by the methods disclosed herein, including a pure elemental M(0) metal film, a film containing an intimate blend of one or more elemental M(0) metals, stratified films of one or more elemental M(0) metals, or films containing both metals and at least one of the main group elements B, C, N, Si or P.

For a film containing both a metal and a main group element, the metal may be directly bound to the main group element, as in Ta(III)N; or it may be a metal film doped with a main group element, such as Co(0) doped with P. In both cases, the source of the main group element may be derived from the metal precursor, or from the addition of chemistry that contains the desired main group element. Ligands on the metal precursor that may be useful for the incorporation of main group elements into a metal film include boranes, borates, alkyls, arenes, alkenes, alkynes, carbenes, carbines, amines, imines, nitriles, isocyanides, nitrosyls, imides, amides, silanes, siloxanes, phosphines, phosphites, and phosphides. Sources of additional chemistry that can be added to the composition to provide the desired main group element includes, boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, and phosphites. For example, a Ta precursor containing a terminal imide bond would be an appropriate precursor to prepare Ta(III) N. In another example, a deposition composition containing cobaltocene and triphenyl phosphine could be used to prepare a Co(0) film doped with P.

For the deposition of metal films in supercritical fluids, metal precursors with metals having any oxidation state can be used. The metal precursor can comprise metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, and mercury. The metal precursor can more preferably comprise metals selected from the group consisting of titanium, zirconium, vanadium, tantalum, hafnium, chromium, molybdenum, tungsten, manganese, iron, cobalt, nickel, palladium, platinum, copper, silver, gold, zinc, cadmium, and mercury. The metal precursor can most preferably comprise metals selected from the group consisting of tantalum, hafnium, zirconium, titanium, tungsten, molybdenum, and chromium.

Early transition metals can be oxophilic and electropositive and can form thermodynamically stable complexes with higher formal oxidation states. In contrast, synthesis, storage, and manipulation of metal precursors comprising electropositive metals having low formal oxidation states can be very challenging.

According to one embodiment, a method for forming a metal film on a semiconductor substrate comprises heating the semiconductor substrate to obtain a heated semiconductor substrate; exposing the heated semiconductor substrate to a composition containing at least one metal precursor comprising at least one ligand, an excess amount of neutral labile ligands, a supercritical solvent, and optionally at least one source of B, C, N, Si, P, and mixtures thereof; exposing the composition to a reducing agent and/or thermal energy at or near the heated semiconductor substrate; disassociating the at least one ligand from the metal precursor; and forming the metal film while minimizing formation of metal oxides.

The neutral labile ligands used in the above process, as described herein, temporarily fill coordination sites on the metal in the metal precursor as they become available such that these empty coordination sites are not filled with anionic Lewis base ligands that can increase the oxidation state of the metal.

Moreover, the neutral labile ligands, described herein, are soluble in the supercritical solvent and can be added in a large molar excess such that they are kinetically favored to fill any empty coordination sites on the low valent metal precursor when it becomes available. The neutral labile ligands can be present in a ratio of at least about 10:1 of moles of neutral labile ligands to moles of the metal precursor, more preferably the neutral labile ligands can be present in a ratio of at least about 100:1 of moles of neutral labile ligands to moles of the metal precursor, and most preferably the neutral labile ligands can be present in a ratio of at least about 1000:1 of moles of neutral labile ligands to moles of the metal precursor.

The molar excess of neutral labile ligands promotes the rapid filling of the empty coordination sites on the metal in the metal precursor. The rapid filling of the empty coordination sites thereby promotes the maintenance of the low oxidation state of the metal which in turn promotes further growth of the metal film.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

The supercritical solvent in the above-described process can be at a temperature of from about 20° C. to about 150° C. The temperature of the semiconductor substrate can be from about 20° C. to about 450° C. Further, the pressure in the above-described process can be from about 1000 psi to about 7000 psi.

According to another embodiment, a method for forming a metal film on a semiconductor substrate comprises heating the semiconductor substrate to obtain a heated semiconductor substrate; exposing the heated semiconductor substrate to a composition containing at least one metal precursor comprising at least one ligand, an excess amount of neutral labile ligands, a supercritical solvent, and at least one source of B, C, N, Si, P, and mixtures thereof; exposing the composition to a reducing agent and/or thermal energy at or near the heated semiconductor substrate; displacing the at least one ligand from the metal precursor with the at least once source of B, C, N, Si, P, and mixtures thereof; and forming the metal film while minimizing formation of metal oxides.

In some embodiments, after the displacing step in the second embodiment, the metal precursor with the at least one source of B, C, N, Si, P, and mixtures thereof is modified to obtain a metal defined by $M_aX_b$, and wherein M is a metal, X is B, C, N, Si, P, or mixtures thereof, and a or b=1 to 5.

The modification can comprise exposing the metal precursor to thermal energy, reducing the metal, reducing the at least one source of B, C, N, Si, P, and mixtures thereof, and/or exposing the metal precursor to a reagent.

The composition of the second embodiment can further comprise (i) at least one reducing agent, and/or (ii) at least one co-solvent.

In preferred embodiments, the reducing agent can be hydrogen.

The source of B, C, N, Si, or P can be selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, and phosphites. In other embodiments, the source of B, C, N, Si or P can be selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, and methyl Grignard.

The supercritical solvent in the above-described processes can be at a temperature of from about 20° C. to about 150° C. The temperature of the semiconductor substrate can be from about 20° C. to about 450° C.

Further, the pressure in the above-described processes can be maintained from about 1000 psi to about 7000 psi.

By using SCF-based deposition compositions, the precursor component(s) can be continuously circulated in a single wafer processing chamber to thereby expose the SCF-based deposition composition to the heated substrate, and deposit the desired metal film deriving from the precursor component(s) on the substrate surface. Concurrently, by-products of the deposition operation can be continuously carried out of the deposition chamber via continuous flow of the SCF-based composition through the deposition chamber containing the heated pedestal and substrate.

Alternatively, the deposition using the SCF-based deposition composition may be carried out in a batch mode, wherein the deposition composition is contacted with the substrate, and process condition(s) (e.g., temperature and/or pressure) of the composition are altered to effect the deposition of the desired material deriving from the composition.

According to an embodiment, supercritical solvent-assisted deposition of a metal film having a thickness of up to about 1 μm on a substrate such as a semiconductor wafer substrate can be carried out.

In some embodiments, the metal film can comprise one or more metals. In other embodiments, one or more layers of the metal film can be deposited. In other embodiments, the metal film may also contain one or more main group elements B, C, N, Si and/or P.

Deposition using the SCF-based deposition compositions can be carried out in any suitable manner, including CVD, and other techniques of application of the deposition composition on the semiconductor substrate.

The above-described processes are useful for processing semiconductor wafers of any size and can be carried out as a single wafer or batch process.

The equipment that can be used in the above-described processes can be any traditionally used equipment for single wafer processing so long as the equipment can withstand supercritical conditions. See, for example, commonly assigned U.S. Pat. Nos. 6,561,220, 6,736,149, and 6,486,078, herein incorporated by reference.

Plasma etching can be performed upstream or downstream of the above-described processes. Plasma etching can be performed in various types of plasma reactors using various types of etch gas chemistries. See, for example, commonly assigned U.S. Pat. No. 6,893,969 titled "Use of ammonia for etching organic low-k dielectrics", U.S. Pat. No. 6,841,483 titled "Unique process chemistry for etching organic low-k materials", U.S. Pat. No. 6,620,733 titled "Use of hydrocarbon addition for the elimination of micromasking during etching of organic low-k dielectrics", and U.S. Pat. No. 6,337,277 titled "Clean chemistry low-k organic polymer etch". See also U.S. Pat. No. 6,909,195 titled "Trench etch process for low k dielectrics" and U.S. Pre-Grant Patent Publication No. 2005/0026430 titled "Selective etching of carbon-doped low-k dielectrics" for an exemplary description of the plasma etching process.

Photoresist ashing can be performed in various types of plasma chambers using various photoresist stripping gas chemistries. The photoresist ashing process is often referred to as a "dry" "cleaning" step. See, for example, commonly assigned U.S. Pat. No. 6,949,411 titled "Method for post-etch and strip residue removal on CORAL films" and U.S. Pat. No. 6,777,344 titled "Post-etch photoresist strip with $O_2$ and $NH_3$ for organosilicate glass low-K dielectric etch applications". See also U.S. Pre-Grant Patent Publication No. 2005/0230351 titled "Plasma processing method and apparatus" and U.S. Pat. No. 6,323,121 titled "Fully dry post-via-etch cleaning method for a damascene process" for an exemplary description of the photoresist ashing process.

A general cleaning process can be performed upstream or downstream of the above-described metal deposition processes. See, for example, commonly assigned U.S. Pat. No. 6,277,203 titled "Method and apparatus for cleaning low K dielectric and metal wafer surfaces". See also U.S. Pre-Grant Patent Publication No. 2005/0279381 titled "Method for cleaning microstructure" and U.S. Pat. No. 6,457,477 titled "Method of cleaning a copper/porous low-k dual damascene etch" for an exemplary description of the general cleaning process.

A barrier layer deposition process can be performed upstream or downstream of the above-described metal deposition processes. See, for example, U.S. Pre-Grant Patent Publication No. 2006/0102895 titled "Precursor compositions for forming tantalum-containing films, and tantalum-containing barrier films and copper-metallized semiconductor device structures" and U.S. Pat. No. 7,049,226 titled "Integration of ALD tantalum nitride for copper metallization" for an exemplary description of the barrier layer deposition process.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A method for forming a metal film on a semiconductor substrate comprising:

heating the semiconductor substrate to obtain a heated semiconductor substrate;

exposing the heated semiconductor substrate to a composition containing at least one metal precursor comprising at least one ligand, an excess amount of neutral labile ligands, a supercritical solvent, and optionally at least one source of B, C, N, Si, P, and mixtures thereof;

exposing the composition to a reducing agent and/or thermal energy at or near the heated semiconductor substrate;

disassociating the at least one ligand from the metal precursor; and forming the metal film while minimizing formation of metal oxides, wherein the metal precursor comprises a transition metal selected from the group consisting of hafnium, zirconium, and mixtures thereof.

2. The method of claim 1, wherein the composition further comprises (i) at least one reducing agent, and/or (ii) at least one co-solvent.

3. The method of claim 2, wherein (i) the reducing agent is selected from the group consisting of zinc, magnesium, cadmium, mercury, sodium, potassium, lithium, boron, aluminum, and alloys thereof, (ii) the reducing agent is selected from the group consisting of hydrogen, alcohols, formaldehyde, silanes, thiols, amines, phosphines, alkenes, dienes, ketones, diketones, heterocyclics, and mixtures thereof, (iii) the reducing agent is selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof, (iv) the reducing agent is hydrogen, (v) the co-solvent is selected from the group consisting of alcohols, ketones, amines, esters, ethers, lactones, carbonates, alkanes, arenes, heterocyclics, amides, and mixtures thereof, vi) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof, (vii) the source of B, C, N, Si, or P is selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, phosphites, and mixtures thereof, and/or (viii) the source of B, C, N, Si or P is selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, methyl Grignard, and mixtures thereof.

4. The method of claim 1, wherein (i) the metal precursor is present in a range of from about 0.001 to about 20% by weight, (ii) the supercritical solvent is present in a range of from about 10% to about 99.9% by weight, (iii) the composition is surfactant-free, (iv) the neutral labile ligands are present in a ratio of at least about 10:1 of moles of neutral labile ligands to moles of the metal precursor, (v) the neutral labile ligands are present in a ratio of at least about 100:1 of moles of neutral labile ligands to moles of the metal precursor, (vi) the neutral labile ligands are present in a ratio of at least about 1000:1 of moles of neutral labile ligands to moles of the metal precursor, (vii) the neutral labile ligands are selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof, (viii) the neutral labile ligands are selected from the group consisting of CO, acetonitrile, tetrahydrofuran, ethyl ether, triethylamine, triphenyl phosphine, ethylene, butadiene, 4-heptanone, and mixtures thereof, (ix) the neutral labile ligands are selected from the group consisting of CO, acetonitrile, tetrahydrofuran, ether, and mixtures thereof, (x) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof, (xi) the metal film comprises one or more elemental metals, and/or (xii) one or more layers of the metal film are deposited.

5. The method of claim 1, wherein (i) the supercritical solvent is at a temperature of from about 20° C. to about 150° C., (ii) the temperature of the semiconductor substrate is from about 20° C. to about 450° C., and/or (iii) the method is carried out in a vessel which is pressurized from about 1000 psi to about 7000 psi.

6. A method for forming a metal film on a semiconductor substrate comprising:
heating the semiconductor substrate to obtain a heated semiconductor substrate;
exposing the heated semiconductor substrate to a composition containing at least one metal precursor comprising at least one ligand, an excess amount of neutral labile ligands, a supercritical solvent, and at least one source of B, C, N, Si, P, and mixtures thereof;
exposing the composition to a reducing agent and/or thermal energy at or near the heated semiconductor substrate;
displacing the at least one ligand from the metal precursor with the at least once source of B, C, N, Si, P, and mixtures thereof; and
forming the metal film while minimizing formation of metal oxides,
wherein the at least one source of B, C, N, Si, P, and mixtures thereof is different from the neutral labile ligands.

7. The method of claim 6, wherein after the displacing step, the metal precursor with the at least one source of B, C, N, Si, P, and mixtures thereof is modified to obtain a metal defined by $M_aX_b$, and wherein M is a metal, X is B, C, N, Si, P, or mixtures thereof, and a or b =1 to 5.

8. The method of claim 7, wherein modification comprises exposing the metal precursor to thermal energy, reducing the metal, reducing the at least one source of B, C, N, Si, P, and mixtures thereof, and/or exposing the metal precursor to a reagent.

9. The method of claim 6, wherein the composition further comprises (i) at least one reducing agent, and/or (ii) at least one co-solvent.

10. The method of claim 9, wherein (i) the reducing agent is selected from the group consisting of zinc, magnesium, cadmium, mercury, sodium, potassium, lithium, boron, aluminum, and alloys thereof, (ii) the reducing agent is selected from the group consisting of hydrogen, alcohols, formaldehyde, silanes, thiols, amines, phosphines, alkenes, dienes, ketones, diketones, heterocyclics, and mixtures thereof, (iii) the reducing agent is selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof, (iv) the reducing agent is hydrogen, (v) the co-solvent is selected from the group consisting of alcohols, ketones, amines, esters, ethers, lactones, carbonates, alkanes, arenes, heterocyclics, amides, and mixtures thereof, vi) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof, (vii) the source of B, C, N, Si, or P is selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, phosphites and mixtures thereof, and/or (viii) the source of B, C, N, Si or P is selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methylithium, methyl Grignard, and mixtures thereof.

11. The method of claim 6, wherein (i) the metal precursor is present in a range of from about 0.001 to about 20% by weight, (ii) the supercritical solvent is present in a range of from about 10% to about 99.9% by weight, (iii) the composition is surfactant-free, (iv) the metal precursor comprises transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof, (v) the metal precursor comprises transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof, (vi) the metal precursor comprises transition metals selected from the group consisting of tantalum, hafnium, zirconium, titanium, tungsten, molybdenum, chromium, and mixtures thereof, (vii) the neutral labile ligands are present in a ratio of at least about 10:1 of moles of neutral labile ligands to moles of the metal precursor, (viii) the neutral labile ligands are present in a ratio of at least about 100:1 of moles of neutral labile ligands to moles of the metal precursor, (ix) the neutral labile ligands are present in a ratio of at least about 1000:1 of moles of neutral labile ligands to moles of the metal precursor, (x) the neutral labile ligands are selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof, (xi) the neutral labile ligands are selected from the group consisting of CO, acetonitrile, tetrahydrofuran, ethyl ether, triethylamine, triphenyl phosphine, ethylene, butadiene, 4-heptanone, and mixtures thereof, (xii) the neutral labile ligands are selected from the group consisting of CO, acetonitrile, tetrahydrofuran, ether, and mixtures thereof, (xiii) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof, (xiv) the metal film comprises one or more elemental metals, and/or (xv) one or more layers of the metal film are deposited.

12. The method of claim 6, wherein (i) the supercritical solvent is at a temperature of from about 20° C. to about 150° C., (ii) the temperature of the semiconductor substrate is from about 20° C. to about 450° C., and/or (iii) the method is carried out in a vessel which is pressurized from about 1000 psi to about 7000 psi.

13. A composition for forming metal films on semiconductor substrates comprising:
at least one metal precursor comprising at least one ligand;
neutral labile ligands;
at least one supercritical solvent; and
optionally at least one source of B, C, N, Si, P, and mixtures thereof,
wherein the metal precursor comprises a transition metal selected from the group consisting of hafnium, zirconium, and mixtures thereof.

14. The composition of claim 13, further comprising (i) at least one reducing agent, and/or (ii) at least one co-solvent.

15. The composition of claim 14, wherein (i) the reducing agent is selected from the group consisting of zinc, magnesium, cadmium, mercury, sodium, potassium, lithium, boron, aluminum, and alloys thereof, (ii) the reducing agent is selected from the group consisting of hydrogen, alcohols, formaldehyde, silanes, thiols, amines, phosphines, alkenes, dienes, ketones, diketones, heterocyclics, and mixtures thereof, (iii) the reducing agent is selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof, (iv) the reducing agent is hydrogen, (v) the co-solvent is selected from the group consisting of alcohols, ketones, amines, esters, ethers, lactones, carbonates, alkanes, arenes, heterocyclics, amides, and mixtures thereof, (vi) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof, (vii) the source of B, C, N, Si, or P is selected from the group consisting of boranes, diborane, alkyls, arenes, alkenes, alkyllithium, Grignard agents, dimethyl magnesium, methyl zinc, organocuprates, peroxides, amines, imines, nitriles, cyanates, azides, azo compounds, silanes, siloxanes, phosphines, phosphites and mixtures thereof, and/or (viii) the source of B, C, N, Si or P is selected from the group consisting of diborane, triphenyl phosphine, triethyl phosphine, ammonia, triethyl amine, triphenyl amine, diazomethane, hydrazine, diphenyl hydrazine, acetonitrile, butyronitrile, silane, disilane, methane, ethane, methyllithium, methyl Grignard, and mixtures thereof.

16. The composition of claim 13, wherein (i) the metal precursor is present in a range of from about 0.001 to about 20% by weight, (ii) the supercritical solvent is present in a range of from about 10% to about 99.9% by weight, (iii) the composition is surfactant-free, (iv) the neutral labile ligands are present in a ratio of at least about 10:1 of moles of neutral labile ligands to moles of the metal precursor, (v) the neutral labile ligands are present in a ratio of at least about 100:1 of moles of neutral labile ligands to moles of the metal precursor, (vi) the neutral labile ligands are present in a ratio of at least about 1000:1 of moles of neutral labile ligands to moles of the metal precursor, (vii) the neutral labile ligands are selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof, (viii) the neutral labile ligands are selected from the group consisting of CO, acetonitrile, tetrahydrofuran, ethyl ether, triethylamine, triphenyl phosphine, ethylene, butadiene, 4-heptanone, and mixtures thereof, (ix) the neutral labile ligands are selected from the group consisting of CO, acetonitrile, tetrahydrofuran, ether, and mixtures thereof, (x) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof, (xi) the metal in the metal precursor has an oxidation state that is lower than the thermodynamically favored oxidation state of the metal, (xii) the metal film comprises one or more elemental metals, and/or (xiii) one or more layers of the metal film are deposited.

* * * * *